(12) United States Patent
Faller

(10) Patent No.: US 8,355,509 B2
(45) Date of Patent: Jan. 15, 2013

(54) PARAMETRIC JOINT-CODING OF AUDIO SOURCES

(75) Inventor: Christof Faller, Tägerwilen (CH)

(73) Assignee: Fraunhofer-Gesellschaft zur Foerderung der Angewandten Forschung e.V., Munich (DE)

(*) Notice: Subject to any disclaimer, the term of this patent is extended or adjusted under 35 U.S.C. 154(b) by 1537 days.

(21) Appl. No.: 11/837,123

(22) Filed: Aug. 10, 2007

(65) Prior Publication Data

US 2007/0291951 A1 Dec. 20, 2007

Related U.S. Application Data

(63) Continuation of application No. PCT/EP2006/050904, filed on Feb. 13, 2006.

(30) Foreign Application Priority Data

Feb. 14, 2005 (EP) .................................... 05101055

(51) Int. Cl.
*H04R 5/00* (2006.01)
*H04B 1/00* (2006.01)

(52) U.S. Cl. ............... 381/22; 381/23; 381/20; 381/119; 704/200; 704/500; 704/501; 700/94

(58) Field of Classification Search .................. 381/119, 381/22, 23, 20; 704/200, 500, 501; 700/94
See application file for complete search history.

(56) References Cited

U.S. PATENT DOCUMENTS

| 5,886,276 | A | * | 3/1999 | Levine et al. | ................... | 84/603 |
| 6,005,948 | A | * | 12/1999 | Maeda | ............................ | 381/18 |
| 6,131,084 | A | | 10/2000 | Hardwick | | |
| 6,188,987 | B1 | * | 2/2001 | Fielder | .......................... | 704/501 |
| 6,539,357 | B1 | | 3/2003 | Sinha | | |

(Continued)

FOREIGN PATENT DOCUMENTS

CN 101133441 A 2/2008

(Continued)

OTHER PUBLICATIONS

Ville Pulkki, Spatial Sound Generation and Perception By Amplitude Panning Techniques,2001, Dissertation for the Degree of Doctor of Science in Technology, Helsinki University of Technology Laboratory of Acoustics and Audio Signal Processing, Chap 3.*

(Continued)

*Primary Examiner* — Walter F Briney, III
*Assistant Examiner* — Kuassi Ganmavo
(74) *Attorney, Agent, or Firm* — Keating & Bennett, LLP

(57) ABSTRACT

The following coding scenario is addressed: A number of audio source signals need to be transmitted or stored for the purpose of mixing wave field synthesis, multi-channel surround, or stereo signals after decoding the source signals. The proposed technique offers significant coding gain when jointly coding the source signals, compared to separately coding them, even when no redundancy is present between the source signals. This is possible by considering statistical properties of the source signals, the properties of mixing techniques, and spatial hearing. The sum of the source signals is transmitted plus the statistical properties of the source signals which mostly determine the perceptually important spatial cues of the final mixed audio channels. Source signals are recovered at the receiver such that their statistical properties approximate the corresponding properties of the original source signals. Subjective evaluations indicate that high audio quality is achieved by the proposed scheme.

19 Claims, 5 Drawing Sheets

U.S. PATENT DOCUMENTS

| | | | |
|---|---|---|---|
| 6,934,677 B2* | 8/2005 | Chen et al. .................. | 704/200.1 |
| 7,116,787 B2* | 10/2006 | Faller .............................. | 381/17 |
| 7,382,886 B2* | 6/2008 | Henn et al. ...................... | 381/23 |
| 7,483,758 B2* | 1/2009 | Liljeryd et al. .................. | 700/94 |
| 7,668,722 B2* | 2/2010 | Villemoes et al. ............ | 704/500 |
| 7,720,230 B2* | 5/2010 | Allamanche et al. ........... | 381/22 |
| 7,787,631 B2* | 8/2010 | Faller .............................. | 381/20 |
| 7,805,313 B2* | 9/2010 | Faller et al. .................... | 704/500 |
| 7,916,873 B2* | 3/2011 | Villemoes et al. .............. | 381/22 |
| 8,078,475 B2* | 12/2011 | Tsushima ..................... | 704/500 |
| 2003/0026441 A1 | 2/2003 | Faller | |
| 2003/0231776 A1 | 12/2003 | Aoki et al. | |
| 2004/0049379 A1 | 3/2004 | Thumpudi et al. | |
| 2004/0101048 A1 | 5/2004 | Paris | |
| 2007/0206690 A1* | 9/2007 | Sperschneider et al. ....... | 375/260 |
| 2007/0291951 A1 | 12/2007 | Faller | |
| 2010/0042406 A1* | 2/2010 | Johnston et al. ........... | 704/200.1 |
| 2011/0002470 A1* | 1/2011 | Purnhagen et al. ............. | 381/23 |

FOREIGN PATENT DOCUMENTS

| | | |
|---|---|---|
| JP | 2004-078183 A | 3/2004 |
| RU | 2 214 048 C2 | 2/2000 |
| WO | 98/20709 A1 | 5/1998 |
| WO | 03/090206 A1 | 10/2003 |
| WO | 03/090208 A1 | 10/2003 |
| WO | 2004/008806 A1 | 1/2004 |
| WO | 2004/036955 A1 | 4/2004 |

OTHER PUBLICATIONS

Philip Lieberman, Sheila Blumstein, Speech Physiology, speech perception and acoustic, Press Syndicate of the University of Cambridge,1988,pp. 159-160.*

Hyun-Soo Kim and W.Harvey Holmes,Spectral Estimation and Speech Analysis Techniques Using Morphological Filters,Dec. 8-10, 2004,Proceedings of the 10th Australian International Conference on Speech Science & Technology, pp. 426-431.*

Baumgarte et al., "Estimation of Auditory Spatial Cues for Binaural Cue Coding", IEEE International Conference on Acoustics, Speech, and Signal Processing, NY, May 13, 2002, vol. 2, pp. II-1801-II-1804.

Official Communication issued in corresponding European Patent Application No. 10179108.5, mailed on Apr. 4, 2011.

Official communication issued in counterpart Russian Application No. 2007134215, mailed on Feb. 2, 2009.

Official Communication issued in corresponding Chinese Patent Application No. 200680004728.5, mailed on Apr. 22, 2010.

Herre, "From Joint Stereo to Spatial Audio Coding—Recent Progress and Standardization", Proceedings of the 7th International Conference on Digital Audio Effects, Oct. 5-8, 2004, pp. 157-162.

Chongzhi et al., "Compression and Coding of Moving Pictures and Associated Audio—MPEG1", Nanjing University Press, Oct. 31, 1995, p. 255.

Official Communication issued in counterpart Russian Application No. 2007134215, dated Jun. 15, 2009.

English translation of Official Communication issued in corresponding Japanese Patent Application No. 2007-554579, mailed on Jun. 14, 2011.

English translation of Official Communication issued in corresponding Chinese Patent Application No. 201110061362.8, mailed on Dec. 12, 2011.

Official communication issued in the counterpart European Application No. PCT/EP2006/050904, mailed on Nov. 21, 2006.

Faller, Christof: "Parametric Coding of Spatial Audio—Thesis No. 3026", 2004, Presentee A La Faculte Informatique Et Communications Institut De Systemes De Communication Section Des Systemes De Communication Ecole Polytechnique Federale De Lausanne Pour L'Obtention Du Grade De Docteur Es Sciences, Chapter 1-8, pp. 1-164, Published 2004.

Faller, Christof et al., "Binaural Cue Coding: A Novel and Efficient Representation of Spatial Audio", 2002 IEEE International Conference on Acoustics, Speech, and Signal Processing, vol. 4 of 4, pp. II-1841, May 13, 2002.

Herre, J. et al., "Intensity Stereo Coding," Feb. 26, 1994, Preprints of Papers Presented at the AES Convention, Amsterdam, pp. 1-10.

Herre J. et al., "Spatial Audio Coding: Next-generation Efficient and Compatible Coding of Multi-Channel Audio", Audio Engineering Society Convention Paper, 117th Convention, San Francisco, CA, Oct. 28-31, 2004.

* cited by examiner

PARAMETRIC JOINT-CODING OF AUDIO SOURCES

BACKGROUND OF THE INVENTION

I. Introduction

In a general coding problem, we have a number of (mono) source signals $s_i(n)$ ($1 \leq i \leq M$) and a scene description vector S(n), where n is the time index. The scene description vector contains parameters such as (virtual) source positions, source widths, and acoustic parameters such as (virtual) room parameters. The scene description may be time-invariant or may be changing over time. The source signals and scene description are coded and transmitted to a decoder. The coded source signals, $\hat{s}_i(n)$ are successively mixed as a function of the scene description, $\hat{S}(n)$, to generate wavefield synthesis, multi-channel, or stereo signals as a function of the scene description vector. The decoder output signals are denoted $\hat{x}_i(n)$ ($0 \leq i \leq N$). Note that the scene description vector S(n) may not be transmitted but may be determined at the decoder. In this document, the term "stereo audio signal" always refers to two-channel stereo audio signals.

ISO/IEC MPEG-4 addresses the described coding scenario. It defines the scene description and uses for each ("natural") source signal a separate mono audio coder, e.g. an AAC audio coder. However, when a complex scene with many sources is to be mixed, the bitrate becomes high, i.e. the bitrate scales up with the number of sources. Coding one source signal with high quality requires about 60-90 kb/s.

Previously, we addressed a special case of the described coding problem [1][2] with a scheme denoted Binaural Cue Coding (BCC) for Flexible Rendering. By transmitting only the sum of the given source signals plus low bitrate side information, low bitrate is achieved. However, the source signals can not be recovered at the decoder and the scheme was limited to stereo and multi-channel surround signal generation. Also, only simplistic mixing was used, based on amplitude and delay panning. Thus, the direction of sources could be controlled but no other auditory spatial image attributes. Another limitation of this scheme was its limited audio quality. Especially, a decrease in audio quality as the number of source signals is increased.

The document [1], (Binaural Cue Coding, Parametric Stereo, MP3 Surround, MPEG Surround) covers the case where N audio channels are encoded and N audio channels with similar cues then the original audio channels are decoded. The transmitted side information includes inter-channel cue parameters relating to differences between the input channels.

The channels of stereo and multi-channel audio signals contain mixes of audio sources signals and are thus different in nature than pure audio source signals. Stereo and multi-channel audio signals are mixed such that when played back over an appropriate playback system, the listener will perceive an auditory spatial image ("sound stage") as captured by the recording setup or designed by the recording engineer during mixing. A number of schemes for joint-coding for the channels of a stereo or multi-channel audio signal have been proposed previously.

SUMMARY OF THE INVENTION

The aim of the invention is to provide a method to transmit a plurality of source signals while using a minimum bandwidth. In most of known methods, the playback format (e.g. stereo, 5.1) is predefined and has a direct influence on the coding scenario. The audio stream on the decoder side should use only this predefined playback format, therefore binding the user to a predefined playback scenario (e.g. stereo).

The proposed invention encodes N audio source signals, typically not channels of a stereo or multi-channel signals, but independent signals, such as different speech or instrument signals. The transmitted side information includes statistical parameters relating to the input audio source signals.

The proposed invention decodes M audio channels with different cues than the original audio source signals. These different cues are either implicitly synthesized by applying a mixer to the received sum signal. The mixer is controlled as a function of the received statistical source information and the received (or locally determined) audio format parameters and mixing parameters. Alternatively, these different cues are explicitly computed as a function of the received statistical source information and the received (or locally determined) audio format parameters and mixing parameters. These computed cues are used to control a prior art decoder (Binaural Cue Coding, Parametric Stereo, MPEG Surround) for synthesizing the output channels given the received sum signal.

The proposed scheme for joint-coding of audio source signals is the first of its kind. It is designed for joint-coding of audio source signals. Audio source signals are usually mono audio signals which are not suitable for playback over a stereo or multi-channel audio system. For brevity, in the following, audio source signals are often denoted source signals.

Audio source signals first need to be mixed to stereo, multi-channel, or wavefield synthesis audio signals prior to playback. An audio source signal can be a single instrument or talker, or the sum of a number of instruments and talkers. Another type of audio source signal is a mono audio signal captured with a spot microphone during a concert. Often audio source signals are stored on multi-track recorders or in harddisk recording systems.

The claimed scheme for joint-coding of audio source signals, is based on only transmitting the sum of the audio source signals, $$s(n) = \sum_{i=1}^{M} s_i(n), \quad (1)$$

or a weighted sum of the source signals. Optionally, weighted summation can be carried out with different weights in different subbands and the weights may be adapted in time. Summation with equalization, as described in Chapter 3.3.2 in [1], may also be applied. In the following, when we refer to the sum or sum signal, we always mean a signal generate by (1) or generated as described. In addition to the sum signal, side information is transmitted. The sum and the side information represent the outputted audio stream. Optionally, the sum signal is coded using a conventional mono audio coder. This stream can be stored in a file (CD, DVD, Harddisk) or broadcasted to the receiver. The side information represents the statistical properties of the source signals which are the most important factors determining the perceptual spatial cues of the mixer output signals. It will be shown that these properties are temporally evolving spectral envelopes and auto-correlation functions. About 3 kb/s of side information is transmitted per source signal. At the receiver, source signals $\hat{s}_i(n)$ ($1 \leq i \leq M$) are recovered with the before mentioned statistical properties approximating the corresponding properties of the original source signals and the sum signal.

BRIEF DESCRIPTION OF THE DRAWINGS

The invention will be better understood thanks to the attached Figures in which.

DETAILED DESCRIPTION OF PREFERRED EMBODIMENTS

II. Definitions, Notation, and Variables

The following notation and variables are used in this paper:
n time index;
i audio channel or source index;
d delay index;
M number of encoder input source signals;
N number of decoder output channels;
$x_i(n)$ mixed original source signals;
$\hat{x}_i(n)$ mixed decoder output signals;
$s_i(n)$ encoder input source signals;
$\hat{s}_i(n)$ transmitted source signals also called pseudo-source signals;
s(n) transmitted sum signal;
$y_i(n)$ L-channel audio signal; (audio signal to be re-mixed);
$\tilde{s}_i(k)$ one subband signal of $s_i(n)$ (similarly defined for other signals);
$E\{\tilde{s}_i^2(n)\}$ short-time estimate of $\tilde{s}_i^2(n)$ (similarly defined for other signals);
ICLD inter-channel level difference;
ICTD inter-channel time difference;
ICC inter-channel coherence;
$\Delta L(n)$ estimated subband ICLD;
$\tau(n)$ estimated subband ICTD;
$c(n)$ estimated subband ICC;
$\tilde{p}_i(n)$ relative source subband power;
$a_i, b_i$ mixer scale factors;
$c_i, d_i$ mixer delays;
$\Delta L_i, \tau(n)$ mixer level and time difference;
$G_i$ mixer source gain;

III. Joint-coding of Audio Source Signals

First, Binaural Cue Coding (BCC), a parametric multi-channel audio coding technique, is described. Then it is shown that with the same insight as BCC is based on one can devise an algorithm for jointly coding the source signals for a coding scenario.

A. Binaural Cue Coding (BCC)

A BCC scheme [1][2] for multi-channel audio coding is shown in the figure bellow. The input multi-channel audio signal is downmixed to a single channel. As opposed to coding and transmitting information about all channel waveforms, only the downmixed signal is coded (with a conventional mono audio coder) and transmitted. Additionally, perceptually motivated "audio channel differences" are estimated between the original audio channels and also transmitted to the decoder. The decoder generates its output channels such that the audio channel differences approximate the corresponding audio channel differences of the original audio signal.

Summing localization implies that perceptually relevant audio channel differences for a loudspeaker signal channel pair are the inter-channel time difference (ICTD) and inter-channel level difference (ICLD). ICTD and ICLD can be related to the perceived direction of auditory events. Other auditory spatial image attributes, such as apparent source width and listener envelopment, can be related to interaural coherence (IC). For loudspeaker pairs in the front or back of a listener, the interaural coherence is often directly related to the inter-channel coherence (ICC) which is thus considered as third audio channel difference measure by BCC. ICTD, ICLD, and ICC are estimated in subbands as a function of time. Both, the spectral and temporal resolution that is used, are motivated by perception.

B. Parametric Joint-coding of Audio Sources

Figure 1:
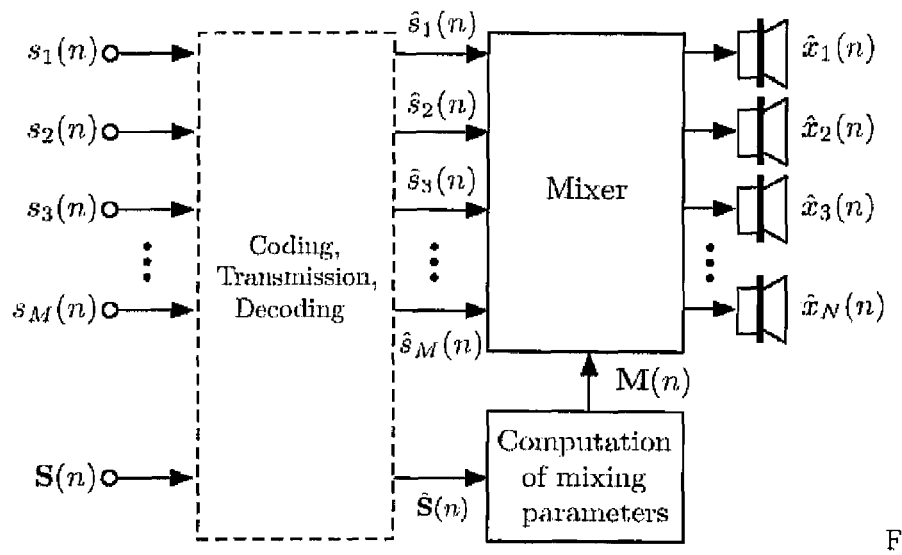
FIG. 1 shows a scheme in which the transmission of each source signal is made independently for further processing.

A BCC decoder is able to generate a multi-channel audio signal with any auditory spatial image by taking a mono signal and synthesizing at regular time intervals a single specific ICTD, ICLD, and ICC cue per subband and channel pair. The good performance of BCC schemes for a wide range of audio material [see 1] implies that the perceived auditory spatial image is largely determined by the ICTD, ICLD, and ICC. Therefore, as opposed to requiring "clean" source signals $s_i(n)$ as mixer input in FIG. 1, we just require pseudo-source signals $\hat{s}_i(n)$ with the property that they result in similar ICTD, ICLD, and ICC at the mixer output as for the case of supplying the real source signals to the mixer. There are three goals for the generation of $\hat{s}_i(n)$:

If $\hat{s}_i(n)$ are supplied to a mixer, the mixer output channels will have approximately the same spatial cues (ICLD, ICTD, ICC) as if $s_i(n)$ were supplied to the mixer.

$\hat{s}_i(n)$ are to be generated with as little as possible information about the original source signals s(n) (because the goal is to have low bitrate side information).

$\hat{s}_i(n)$ are generated from the transmitted sum signal s(n) such that a minimum amount of signal distortion is introduced.

Figure 4:
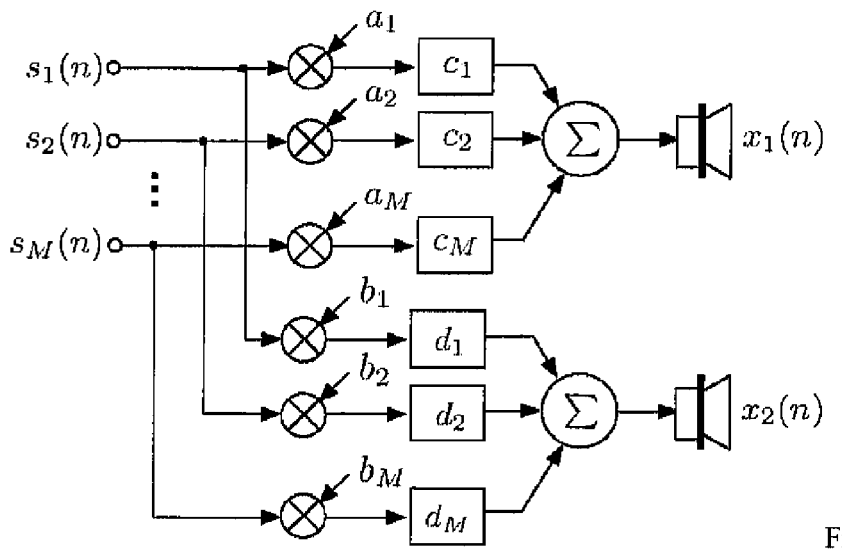
FIG. 4 shows a mixer for generating stereo signals based on several source signals.

For deriving the proposed scheme we are considering a stereo mixer (M=2). A further simplification over the general case is that only amplitude and delay panning are applied for mixing. If the discrete source signals were available at the decoder, a stereo signal would be mixed as shown in FIG. 4, i.e.

$$x_1(n) = \sum_{i=1}^{M} a_i s_i(n - c_i) \quad x_2(n) = \sum_{i=1}^{M} b_i s_i(n - d_i) \tag{2}$$

In this case, the scene description vector S(n) contains just source directions which determine the mixing parameters, $$M(n) = (a_1, a_2, \ldots, a_M, b_1, b_2, \ldots, b_M, c_1, c_2, \ldots, c_M, d_1, d_2, \ldots, d_M)^T \quad (3)$$

where T is the transpose of a vector. Note that for the mixing parameters we ignored the time index for convenience of notation.

More convenient parameters for controlling the mixer are time and level difference, $T_i$ and $\Delta L_i$, which are related to $a_i$, $b_i$, $c_i$, and $d_i$ by $$a_i = \frac{10^{G_i/20}}{\sqrt{1 + 10^{\Delta L_i/10}}} \quad (4)$$

$$b_i = 10^{(G_i + \Delta L_i)/20} a_i$$

$$c_i = \max\{-T_i, 0\}$$

$$d_i = \max\{T_i, 0\}$$

where $G_i$ is a source gain factor in dB.

In the following, we are computing ICTD, ICLD, and ICC of the stereo mixer output as a function of the input source signals $s_i(n)$. The obtained expressions will give indication which source signal properties determine ICTD, ICLD, and ICC (together with the mixing parameters). $\hat{s}_i(n)$ are then generated such that the identified source signal properties approximate the corresponding properties of the original source signals.

B.1 ICTD, ICLD, and ICC of the Mixer Output

The cues are estimated in subbands and as a function of time. In the following it is assumed that the source signals $s_i(n)$ are zero mean and mutually independent. A pair of subband signals of the mixer output (2) is denoted $\hat{x}_1(n)$ and $\hat{x}_2(n)$. Note that for simplicity of notation we are using the same time index n for time-domain and subband-domain signals. Also, no subband index is used and the described analysis/processing is applied to each subband independently. The subband power of the two mixer output signals is $$E\{\tilde{x}_1^2(n)\} = \sum_{i=1}^M a_i^2 E\{\tilde{s}_i^2(n)\} \quad (5)$$

$$E\{\tilde{x}_2^2(n)\} = \sum_{i=1}^M b_i^2 E\{\tilde{s}_i^2(n)\}$$

where $\tilde{s}_i(n)$ is one subband signal of source $s_i(n)$ and $E\{\cdot\}$ denotes short-time expectation, e.g.

$$E\{\tilde{s}_i^2(n)\} = \frac{1}{K} \sum_{n-K/2}^{n+K/2-1} \tilde{s}_i^2(n) \quad (6)$$

where K determines the length of the moving average. Note that the subband power values $E\{\tilde{s}_i^2(n)\}$ represent for each source signal the spectral envelope as a function of time. The ICLD, $\Delta L(n)$, is $$\Delta L(n) = 10 \log_{10} \frac{\sum_{i=1}^M b_i^2 E\{\tilde{s}_i^2(n)\}}{\sum_{i=1}^M a_i^2 E\{\tilde{s}_i^2(n)\}} \quad (7)$$

For estimating ICTD and ICC the normalized cross-correlation function, $$\Phi(n, d) = \frac{E\{\tilde{x}_1(n)\tilde{x}_2(n+d)\}}{\sqrt{E\{\tilde{x}_1^2(n)\}E\{\tilde{x}_2^2(n+d)\}}} \quad (8)$$

is estimated. The ICC, c(n), is computed according to $$c(n) = \max_d \Phi(n, d) \quad (9)$$

For the computation of the ICTD, T(n), the location of the highest peak on the delay axis is computed, $$T(n) = \arg\max_d \Phi(n, d) \quad (10)$$

Now the question is, how can the normalized cross-correlation function be computed as a function of the mixing parameters. Together with (2), (8) can be written as $$\Phi(n, d) = \frac{\sum_{i=1}^M E\{a_i b_i \tilde{s}_i(n - c_i)\tilde{s}_i(n - d_i + d)\}}{\sqrt{E\left\{\sum_{i=1}^M a_i^2 \tilde{s}_i^2(n - c_i)\right\} E\left\{\sum_{i=1}^M b_i^2 \tilde{s}_i^2(n - d_i)\right\}}} \quad (11)$$

which is equivalent to $$\Phi(n, d) = \frac{\sum_{i=1}^M a_i b_i E\{\tilde{s}_i^2(n)\} \Phi_i(n, d_i - T_i)}{\sqrt{\left(\sum_{i=1}^M a_i^2 E\{\tilde{s}_i^2(n)\}\right)\left(\sum_{i=1}^M b_i^2 E\{\tilde{s}_i^2(n)\}\right)}} \quad (12)$$

where the normalized auto-correlation function $\Phi(n,e)$ is $$\Phi(n, e) = \frac{E\{s_i(n)s_i(n+e)\}}{E\{s_i^2(n)\}} \quad (13)$$

and $T_i = d_i - c_i$. Note that for computing (12) given (11) it has been assumed that the signals are wide sense stationary within the considered range of delays, i.e.

$$E\{\tilde{s}_i^2(n)\} = E\{\tilde{s}_i^2(n - c_i)\}$$

$$E\{\tilde{s}_i^2(n)\} = E\{\tilde{s}_i^2(n - d_i)\}$$

$$E\{\tilde{s}_i(n)\tilde{s}_i(n + c_i - d_i + d)\} = E\{\tilde{s}_i(n - c_i)\tilde{s}_i(n - d_i + d)\}$$

Figure 5:
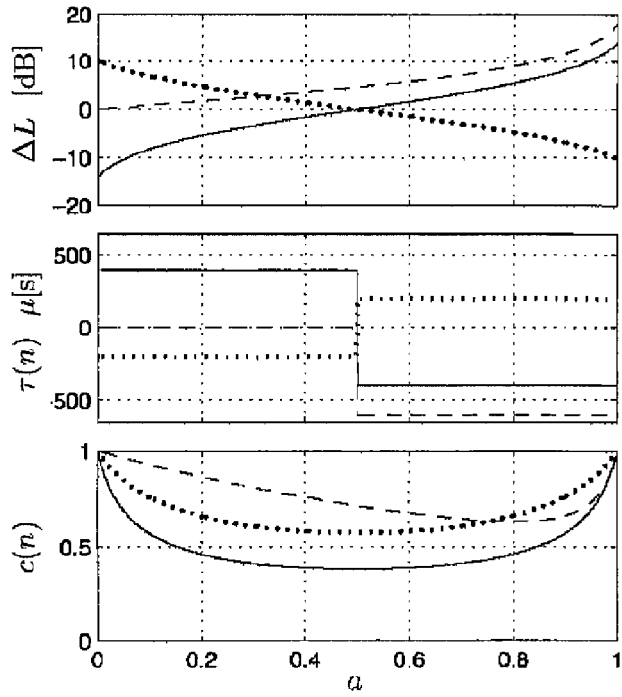
FIG. 5 shows the dependence between ICTD, ICLD and ICC and the source signal subband power.

A numerical example for two source signals, illustrating the dependence between ICTD, ICLD, and ICC and the source subband power, is shown in FIG. 5. The top, middle, and bottom panel of FIG. 5 show $\Delta L(n)$, $T(n)$, and $c(n)$, respectively, as a function of the ratio of the subband power of the two source signals, $a=E\{\tilde{s}_1^2(n)\}/(E\{\tilde{s}_1^2(n)\}+E\{\tilde{s}_2^2(n)\})$, for different mixing parameters (4) $\Delta L_1$, $\Delta L_2$, $T_1$ and $T_2$. Note that when only one source has power in the subband ($a=0$ or $a=1$), then the computed $\Delta L(n)$ and $T(n)$ are equal to the mixing parameters ($\Delta L_1$, $\Delta L_2$, $T_1$, $T_2$).

B.2 Necessary Side Information

The ICLD (7) depends on the mixing parameters ($a_i$, $b_i$, $c_i$, $d_i$) and on the short-time subband power of the sources, $E\{\tilde{s}_i^2(n)\}$ (6). The normalized subband cross-correlation function $\Phi(n,d)$ (12), that is needed for ICTD (10) and ICC (9) computation, depends on $E\{\tilde{s}_i^2(n)\}$ and additionally on the normalized subband auto-correlation function, $\Phi_i(n, e)$ (13), for each source signal. The maximum of $\Phi(n,d)$ lies within the range $\min_i\{T_i\} \leq d \leq \max_i\{T_i\}$. For source i with mixer parameter $T_i = d_i - c_i$, the corresponding range for which the source signal subband property $\Phi_i(n, e)$ (13) is needed is $$\min_l\{T_l\} - T_i \leq e \leq \max_l\{T_l\} - T_i \quad (14)$$

Since the ICTD, ICLD, and ICC cues depend on the source signal subband properties $E\{\tilde{s}_i^2(n)\}$ and $\Phi_i(n, e)$ in the range (14), in principle these source signal subband properties need to be transmitted as side information. We assume that any other kind of mixer (e.g. mixer with effects, wavefield synthesis mixer/convoluter, etc.) has similar properties and thus this side information is useful also when other mixers than the described one are used. For reducing the amount of side information, one could store a set of predefined auto-correlation functions in the decoder and only transmit indices for choosing the ones most closely matching the source signal properties. A first version of our algorithm assumes that within the range (14) $\Phi_i(n, e)=1$ and thus (12) is computed using only the subband power values (6) as side information. The data shown in FIG. 5 has been computed assuming $\Phi_i(n, e)=1$.

In order to reduce the amount of side information, the relative dynamic range of the source signals is limited. At each time, for each subband the power of the strongest source is selected. We found it sufficient to lower bound the corresponding subband power of all the other sources at a value 24 dB lower than the strongest subband power. Thus the dynamic range of the quantizer can be limited to 24 dB.

Assuming that the source signals are independent, the decoder can compute the sum of the subband power of all sources as $E\{\tilde{s}^2(n)\}$. Thus, in principle it is enough to transmit to the decoder only the subband power values of M-1 sources, while the subband power of the remaining source can be computed locally. Given this idea, the side information rate can be slightly reduced by transmitting the subband power of sources with indices $2 \leq i \leq M$ relative to the power of the first source, $$\Delta \tilde{p}_i(n) = 10 \log_{10} \frac{E\{\tilde{s}_i^2(n)\}}{E\{\tilde{s}_1^2(n)\}}. \quad (15)$$

Note that dynamic range limiting as described previously is carried out prior to (15). As an alternative, the subband power values could be normalized relative to the sum signal subband power, as opposed to normalization relative to one source's subband power (15). For a sampling frequency of 44.1 kHz we use 20 subbands and transmit for each subband $\Delta \tilde{p}_i(n)$ ($2 \leq i \leq M$) about every 12 ms. 20 subbands corresponds to half the spectral resolution of the auditory system (one subband is two "critical bandwidths" wide). Informal experiments indicate that only slight improvement is achieved by using more subbands than 20, e.g. 40 subbands. The number of subbands and subband bandwidths are chosen according to the time and frequency resolution of the auditory system. A low quality implementation of the scheme requires at least three subbands (low, medium, high frequencies).

According to a particular embodiment, the subbands have different bandwidths, subbands at lower frequencies have smaller bandwidth than subbands at higher frequencies.

Figure 2:
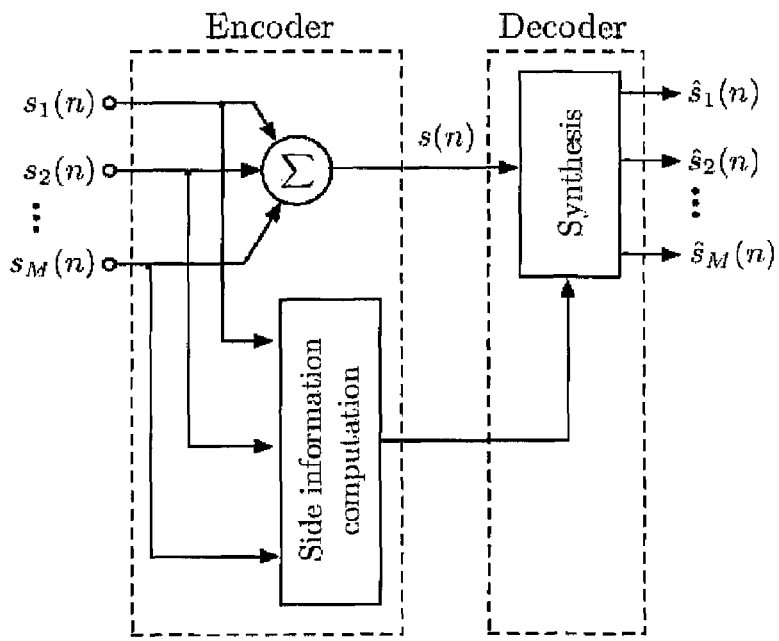
FIG. 2 shows a number of sources transmitted as sum signal plus side information.
Figure 3:
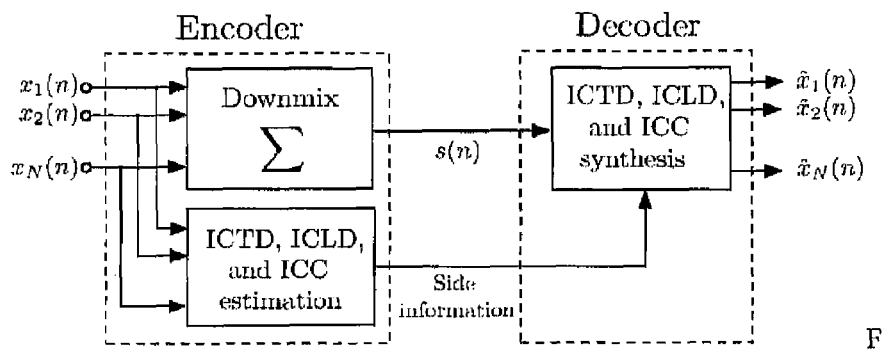
FIG. 3 shows a block diagram of a Binaural Cue Coding (BCC) scheme.
Figure 6:
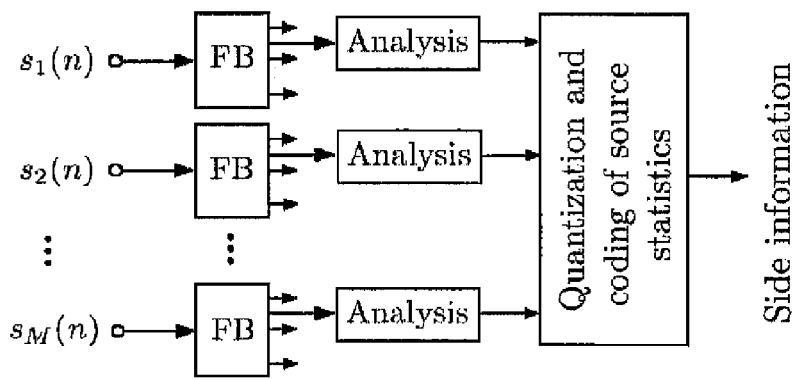
FIG. 6 shows the process of side information generation.

The relative power values are quantized with a scheme similar to the ICLD quantizer described in [2], resulting in a bitrate of approximately $3(M-1)$ kb/s. FIG. 6 illustrates the process of side information generation (corresponds to the "Side information generation" block in FIG. 2).

Side information rate can be additionally reduced by analyzing the activity for each source signal and only transmitting the side information associated with the source if it is active.

Figure 7:
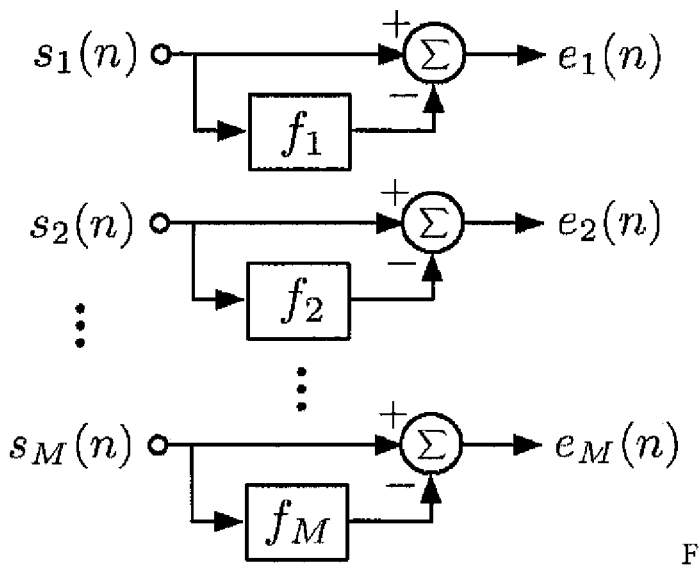
FIG. 7 shows the process of estimating the LPC parameters of each source signal.

As opposed to transmitting the subband power values $E\{\tilde{s}_i^2(n)\}$ as statistical information, other information representing the spectral envelopes of the source signals could be transmitted. For example, linear predictive coding (LPC) parameters could be transmitted, or corresponding other parameters such as lattice filter parameters or line spectral pair (LSP) parameters. The process of estimating the LPC parameters of each source signal is illustrated in FIG. 7.

B.3 Computing $\hat{s}_i(n)$

Figure 8:
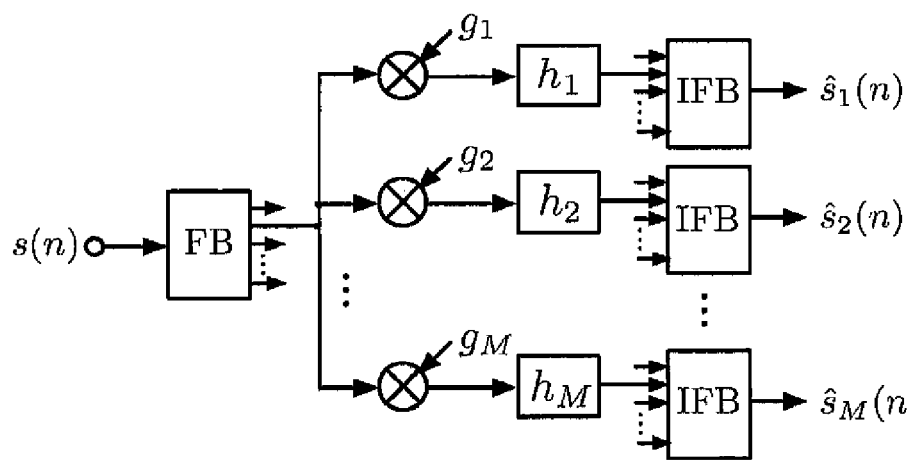
FIG. 8 shows the process of re-creating the source signals from a sum signal.

FIG. 8 illustrates the process that is used to re-create the source signals, given the sum signal (1). This process is part of the "Synthesis" block in FIG. 2. The individual source signals are recovered by scaling each subband of the sum signal with $g_i(n)$ and by applying a de-correlation filter with impulse response $h_i(n)$, $$\hat{\tilde{s}}_i(n) = h_i(n) * (g_i(n)\tilde{s}(n)) = h_i(n) * \left(\sqrt{\frac{E\{\tilde{s}_i^2(n)\}}{E\{\tilde{s}^2(n)\}}}\tilde{s}(n)\right) \quad (16)$$

where * is the linear convolution operator and $E\{\tilde{s}_i^2(n)\}$ is computed with the side information by $$E\{\tilde{s}_i^2(n)\} = 1 / \sqrt{1 + \sum_{i=2}^{M} 10^{\frac{\Delta \tilde{p}_i(n)}{10}}} \quad \text{for } i = 1 \text{ or} \quad (17)$$

$$10^{\frac{\Delta \tilde{p}_i(n)}{10}} E\{\tilde{s}_1^2(n)\} \text{ otherwise}$$

As de-correlation filters $h_i(n)$, complementary comb filters, all-pass filters, delays, or filters with random impulse responses may be used. The goal for the de-correlation process is to reduce correlation between the signals while not modifying how the individual waveforms are perceived. Different de-correlation techniques cause different artifacts. Complementary comb filters cause coloration. All the described techniques are spreading the energy of transients in time causing artifacts such as "pre-echoes". Given their potential for artifacts, de-correlation techniques should be applied as little as possible. The next section describes techniques and strategies which require less de-correlation processing than simple generation of independent signals $\hat{s}_i(n)$.

Figure 9:
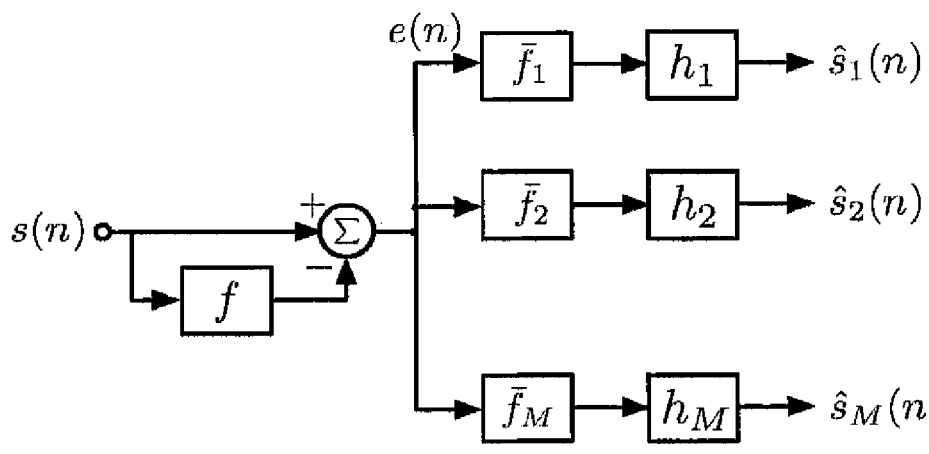
FIG. 9 shows an alternative scheme for the generation of each signal from the sum signal.

An alternative scheme for generation of the signals $\hat{s}_i(n)$ is shown in FIG. 9. First the spectrum of s(n) is flattened by means of computing the linear prediction error e(n). Then, given the LPC filters estimated at the encoder, $f_i$, the corresponding all-pole filters are computed as the inverse z-transform of $$\bar{F}_i(z) = \frac{1}{1 - z^{-1} F_i(z)}$$

The resulting all-pole filters, $\bar{f}_i$, represent the spectral envelope of the source signals. If other side information than LPC parameters is transmitted, the LPC parameters first need to be computed as a function of the side information. As in the other scheme, de-correlation filters $h_i$ are used for making the source signals independent.

IV. Implementations Considering Practical Constraints

In the first part of this section, an implementation example is given, using a BCC synthesis scheme as a stereo or multi-channel mixer. This is particularly interesting since such a BCC type synthesis scheme is part of an upcoming ISO/IEC MPEG standard, denoted "spatial audio coding". The source signals $\hat{s}_i(n)$ are not explicitly computed in this case, resulting in reduced computational complexity. Also, this scheme offers the potential for better audio quality since effectively less de-correlation is needed than for the case when the source signals $\hat{s}_i(n)$ are explicitly computed.

The second part of this section discusses issues when the proposed scheme is applied with any mixer and no de-correlation processing is applied at all. Such a scheme has a lower complexity than a scheme with de-correlation processing, but may have other drawbacks as will be discussed.

Ideally, one would like to apply de-correlation processing such that the generated $\hat{s}_i(n)$ can be considered independent. However, since de-correlation processing is problematic in terms of introducing artifacts, one would like to apply de-correlation processing as little as possible. The third part of this section discusses how the amount of problematic de-correlation processing can be reduced while getting benefits as if the generated $\hat{s}_i(n)$ were independent.

A. Implementation without Explicit Computation of $\hat{s}_i(n)$

Mixing is directly applied to the transmitted sum signal (1) without explicit computation of $\hat{s}_i(n)$. A BCC synthesis scheme is used for this purpose. In the following, we are considering the stereo case, but all the described principles can be applied for generation of multi-channel audio signals as well.

Figure 10:
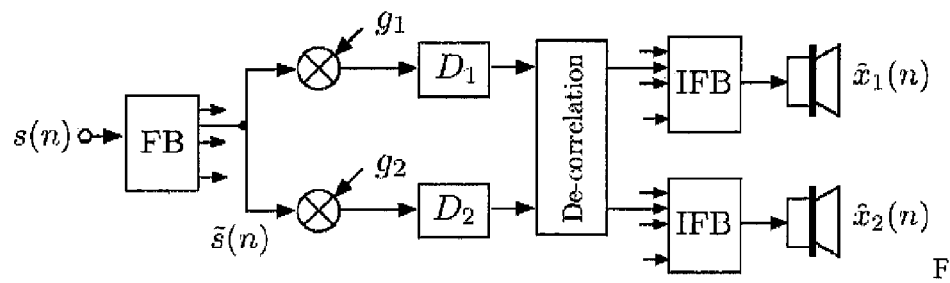
FIG. 10 shows a mixer for generating stereo signals based on the sum signal.

A stereo BCC synthesis scheme (or a "parametric stereo" scheme), applied for processing the sum signal (1), is shown in FIG. 10. Desired would be that the BCC synthesis scheme generates a signal that is perceived similarly as the output signal of a mixer as shown in FIG. 4. This is so, when ICTD, ICLD, and ICC between the BCC synthesis scheme output channels are similar as the corresponding cues appearing between the mixer output (4) signal channels.

The same side information as for the previously described more general scheme is used, allowing the decoder to compute the short-time subband power values $E\{\tilde{s}_i^2(n)\}$ of the sources. Given $E\{\tilde{s}_i^2(n)\}$, the gain factors $g_1$ and $g_2$ in FIG. 10 are computed as $$g_1(n) = \sqrt{\frac{\sum_{i=1}^{M} a_i^2 E\{\tilde{s}_i^2(n)\}}{E\{\tilde{s}^2(n)\}}} \quad g_{2=}(n) \sqrt{\frac{\sum_{i=1}^{M} b_i^2 E\{\tilde{s}_i^2(n)\}}{E\{\tilde{s}^2(n)\}}} \quad (18)$$

such that the output subband power and ICLD (7) are the same as for the mixer in FIG. 4. The ICTD T(n) is computed according to (10), determining the delays $D_1$ and $D_2$ in FIG. 10, $$D_1(n) = \max\{-T(n), o\} \quad D_2(n) = \max\{T(n), 0\} \quad (19)$$

The ICC c(n) is computed according to (9) determining the de-correlation processing in FIG. 10. De-correlation processing (ICC synthesis) is described in [1]. The advantages of applying de-correlation processing to the mixer output channels compared to applying it for generating independent $\hat{s}_i(n)$ are:

Usually the number of source signals M is larger than the number of audio output channels N. Thus, the number of independent audio channels that need to be generated is smaller when de-correlating the N output channels as opposed to de-correlating the M source signals.

Often the N audio output channels are correlated (ICC>0) and less de-correlation processing can be applied than would be needed for generating independent M or N channels.

Due to less de-correlation processing better audio quality is expected.

Best audio quality is expected when the mixer parameters are constrained such that $a_i^2 + b_i^2 = 1$, i.e. $G_i = 0$ dB. In this case, the power of each source in the transmitted sum signal (1) is the same as the power of the same source in the mixed decoder output signal. The decoder output signal (FIG. 10) is the same as if the mixer output signal (FIG. 4) were encoded and decoded by a BCC encoder/decoder in this case. Thus, also similar quality can be expected.

The decoder can not only determine the direction at which each source is to appear but also the gain of each source can be varied. The gain is increased by choosing $a_i^2 + b_i^2 > 1$ ($G_i > 0$ dB) and decreased by choosing $a_i^2 + b_i^2 < 1$ ($G_i < 0$ dB).

B. Using No De-correlation Processing

The restriction of the previously described technique is that mixing is carried out with a BCC synthesis scheme. One could imagine implementing not only ICTD, ICLD, and ICC synthesis but additionally effects processing within the BCC synthesis.

However, it may be desired that existing mixers and effects processors can be used. This also includes wavefield synthesis mixers (often denoted "convoluters"). For using existing mixers and effects processors, the $\hat{s}_i(n)$ are computed explicitly and used as if they were the original source signals.

When applying no de-correlation processing ($h_i(n) = \delta(n)$ in (16)) good audio quality can also be achieved. It is a compromise between artifacts introduced due to de-correlation processing and artifacts due to the fact that the source signals $\hat{s}_i(n)$ are correlated. When no de-correlation processing is used the resulting auditory spatial image may suffer from instability [1]. But the mixer may introduce itself some de-correlation when reverberators or other effects are used and thus there is less need for de-correlation processing.

Figure 11:
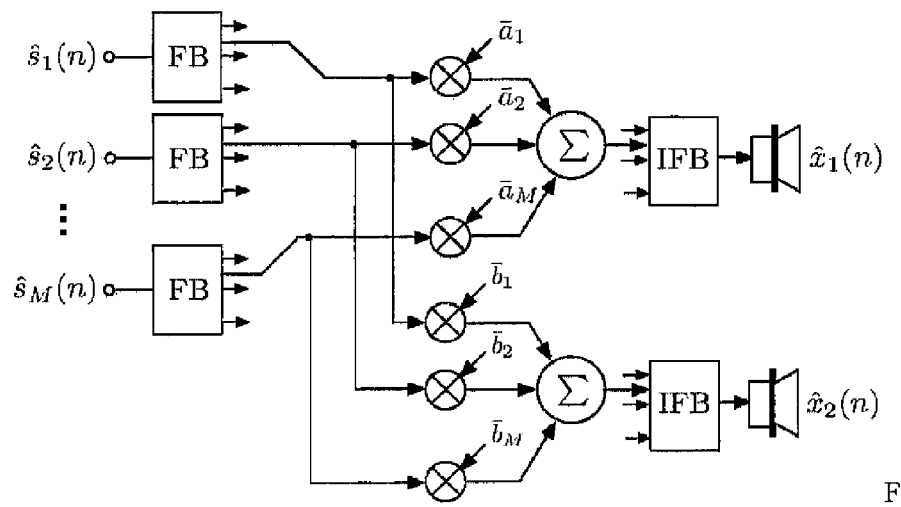
FIG. 11 shows an amplitude panning algorithm preventing that the source levels depends on the mixing parameters.

If $\hat{s}_i(n)$ are generated without de-correlation processing, the level of the sources depends on the direction to which they are mixed relative to the other sources. By replacing amplitude panning algorithms in existing mixers with an algorithm compensating for this level dependence, the negative effect of loudness dependence on mixing parameters can be circumvented. A level compensating amplitude algorithm is shown in FIG. 11 which aims to compensate the source level dependence on mixing parameters. Given the gain factors of a conventional amplitude panning algorithm (e.g. FIG. 4), $a_i$ and $b_i$, the weights in FIG. 11, $\bar{a}_i$ and $\bar{b}_i$, are computed by $$\bar{a}_i(n) \sqrt{\frac{\sum_{i=1}^{M} a_i^2 E\{\tilde{s}_i^2(n)\}}{E\left\{\left(\sum_{i=1}^{M} a_i \tilde{s}_i(n)\right)^2\right\}}} \text{ and } \bar{b}_i(n) \sqrt{\frac{\sum_{i=1}^{M} b_i^2 E\{\tilde{s}_i^2(n)\}}{E\left\{\left(\sum_{i=1}^{M} b_i \tilde{s}_i(n)\right)^2\right\}}} \quad (20)$$

Note that $\bar{a}_i$ and $\bar{b}_i$ are computed such that the output subband power is the same as if $\hat{s}_i(n)$ were independent in each subband.

c. Reducing the Amount of De-correlation Processing

As mentioned previously, the generation of independent $\hat{s}_i(n)$ is problematic. Here strategies are described for applying less de-correlation processing, while effectively getting a similar effect as if the $\hat{s}_i(n)$ were independent.

Figure 12:
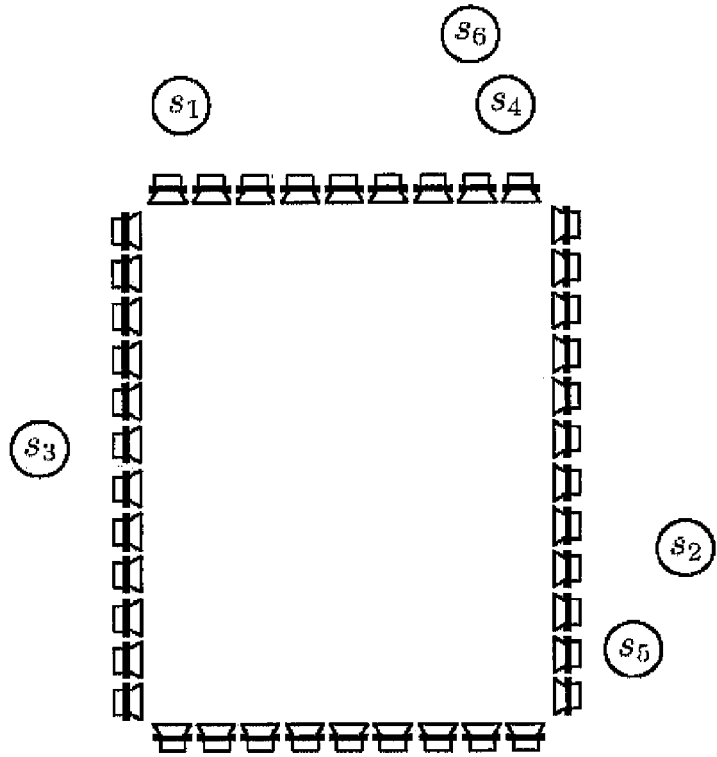
FIG. 12 shows a loudspeaker array of a wavefield synthesis playback system.

Consider for example a wavefield synthesis system as shown in FIG. 12. The desired virtual source positions for $s_1$, $s_2$, ..., $s_6$ (M=6) are indicated. A strategy for computing $\hat{s}_i(n)$ (16) without generating M fully independent signals is:

1. Generate groups of source indices corresponding to sources close to each other. For example in FIG. 8 these could be: {1}, {2, 5}, {3}, and {4, 6}.
2. At each time in each subband select the source index of the strongest source, $$i_{max} = \max_i E\{\tilde{s}(n)\} \quad (21)$$

Apply no de-correlation processing for the source indices part of the group containing $i_{max}$, i.e. $h_i(n)=\delta(n)$.
3. For each other group choose the same $h_i(n)$ within the group.

The described algorithm modifies the strongest signal components least. Additionally, the number of different $h_i(n)$ that are used are reduced. This is an advantage because de-correlation is easier the less independent channels need to be generated. The described technique is also applicable when stereo or multi-channel audio signals are mixed.

V. Scalability in Terms of Quality and Bitrate

The proposed scheme transmits only the sum of all source signals, which can be coded with a conventional mono audio coder. When no mono backwards compatibility is needed and capacity is available for transmission/storage of more than one audio waveform, the proposed scheme can be scaled for use with more than one transmission channel. This is implemented by generating several sum signals with different subsets of the given source signals, i.e. to each subset of source signals the proposed coding scheme is applied individually. Audio quality is expected to improve as the number of transmitted audio channels is increased because less independent channels have to be generated by de-correlation from each transmitted channel (compared to the case of one transmitted channel).

VI. Backwards Compatibility to Existing Stereo and Surround Audio Formats

Consider the following audio delivery scenario. A consumer obtains a maximum quality stereo or multi-channel surround signal (e.g. by means of an audio CD, DVD, or on-line music store, etc.). The goal is to optionally deliver to the consumer the flexibility to generate a custom mix of the obtained audio content, without compromising standard stereo/surround playback quality.

This is implemented by delivering to the consumer (e.g. as optional buying option in an on-line music store) a bit stream of side information which allows computation of $\hat{s}_i(n)$ as a function of the given stereo or multi-channel audio signal. The consumer's mixing algorithm is then applied to the $\hat{s}_i(n)$. In the following, two possibilities for computing $\hat{s}_i(n)$, given stereo or multi-channel audio signals, are described.

A. Estimating the Sum of the Source Signals at the Receiver

Figure 13:
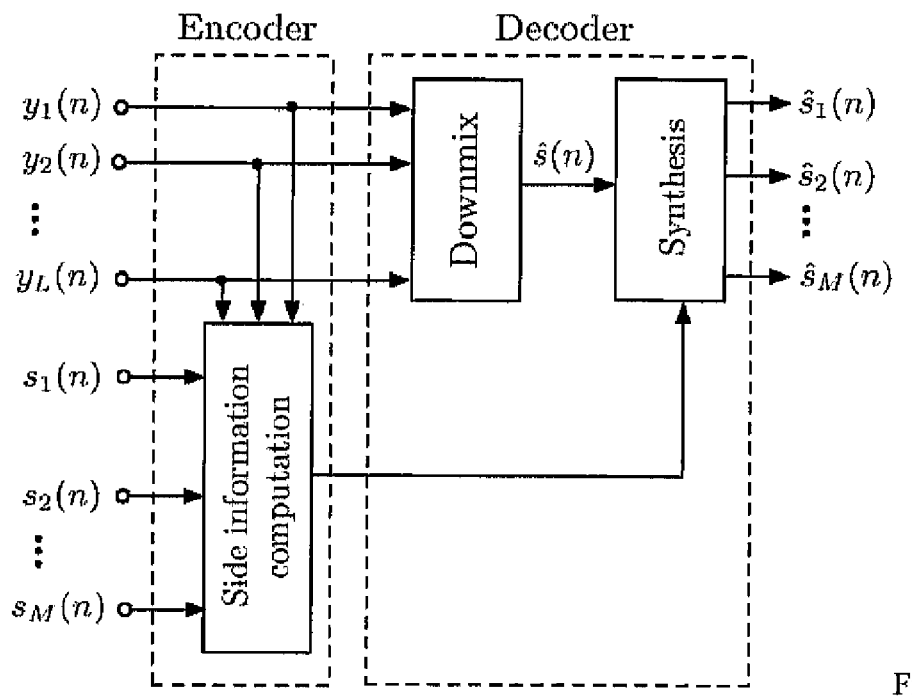
FIG. 13 shows how to recover an estimate of the source signals at the receiver by processing the downmix of the transmitted channels.

The most straight forward way of using the proposed coding scheme with a stereo or multi-channel audio transmission is illustrated in FIG. 13, where $y_i(n)$ ($1 \leq i \leq L$) are the L channels of the given stereo or multi-channel audio signal. The sum signal of the sources is estimated by downmixing the transmitted channels to a single audio channel. Downmixing is carried out by means of computing the sum of the channels $y_i(n)$ ($1 \leq i \leq L$) or more sophisticated techniques may be applied.

For best performance, it is recommended that the level of the source signals is adapted prior to $E\{\tilde{s}_i^2(n)\}$ estimation (6) such that the power ratio between the source signals approximates the power ratio with which the sources are contained in the given stereo or multi-channel signal. In this case, the downmix of the transmitted channels is a relatively good estimate of the sum of the sources (1) (or a scaled version thereof).

An automated process may be used to adjust the level of the encoder source signal inputs $s_i(n)$ prior to computation of the side information. This process adaptively in time estimates the level at which each source signal is contained in the given stereo or multi-channel signal. Prior to side information computation, the level of each source signal is then adaptively in time adjusted such that it is equal to the level at which the source is contained in the stereo or multi-channel audio signal.

B. Using the Transmitted Channels Individually

Figure 14:
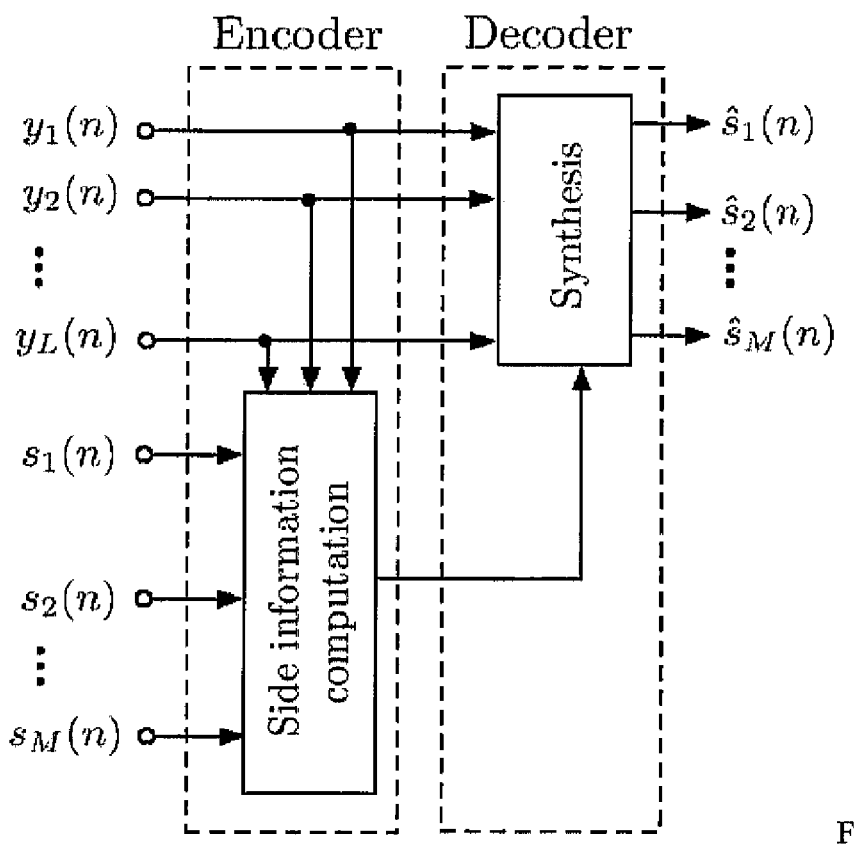
FIG. 14 shows how to recover an estimate of the source signals at the receiver by processing the transmitted channels.

FIG. 14 shows a different implementation of the proposed scheme with stereo or multi-channel surround signal transmission. Here, the transmitted channels are not downmixed, but used individually for generation of the $\hat{s}_i(n)$. Most generally, the subband signals of $\hat{s}_i(n)$ are computed by $$\hat{\tilde{s}}_i(n) = h_i(n) * \left(g_i(n) \sum_{l=1}^{L} w_l(n) \tilde{y}_l(n)\right) \quad (22)$$

where $w_l(n)$ are weights determining specific linear combinations of the transmitted channels' subbands. The linear combinations are chosen such that the $\hat{s}_i(n)$ are already as much decorrelated as possible. Thus, no or only a small amount of de-correlation processing needs to be applied, which is favorable as discussed earlier.

VII. Applications

Already previously we mentioned a number of applications for the proposed coding schemes. Here, we summarize these and mention a few more applications.

A. Audio Coding for Mixing

Whenever audio source signals need to be stored or transmitted prior to mixing them to stereo, multi-channel, or wavefield synthesis audio signals, the proposed scheme can be applied. With prior art, a mono audio coder would be applied to each source signal independently, resulting in a bitrate which scales with the number of sources. The proposed coding scheme can encode a high number of audio source signals with a single mono audio coder plus relatively low bitrate side information. As described in Section V, the audio quality can be improved by using more than one transmitted channel, if the memory/capacity to do so is available.

B. Re-mixing with Meta-data

As described in Section VI, existing stereo and multi-channel audio signals can be re-mixed with the help of additional side information (i.e. "meta-data"). As opposed to only selling optimized stereo and multi-channel mixed audio content, meta data can be sold allowing a user to re-mix his stereo and multi-channel music. This can for example also be used for attenuating the vocals in a song for karaoke, or for attenuating specific instruments for playing an instrument along the music.

Even if storage would not be an issue, the described scheme would be very attractive for enabling custom mixing of music. That is, because it is likely that the music industry would never be willing to give away the multi-track recordings. There is too much a danger for abuse. The proposed scheme enables re-mixing capability without giving away the multi-track recordings.

Furthermore, as soon as stereo or multi-channel signals are re-mixed a certain degree of quality reduction occurs, making illegal distribution of re-mixes less attractive.

c. Stereo/Multi-channel to Wavefield Synthesis Conversion

Another application for the scheme described in Section VI is described in the following. The stereo and multi-channel (e.g. 5.1 surround) audio accompanying moving pictures can be extended for wavefield synthesis rendering by adding side information. For example, Dolby AC-3 (audio on DVD) can be extended for 5.1 backwards compatibly coding audio for wavefield synthesis systems, i.e. DVDs play back 5.1 surround sound on conventional legacy players and wavefield synthesis sound on a new generation of players supporting processing of the side information.

VIII. Subjective Evaluations

We implemented a real-time decoder of the algorithms proposed in Section IV-A and IV-B. An FFT-based STFT filterbank is used. A 1024-point FFT and a STFT window size of 768 (with zero padding) are used. The spectral coefficients are grouped together such that each group represents signal with a bandwidth of two times the equivalent rectangular bandwidth (ERB). Informal listening revealed that the audio quality did not notably improve when choosing higher frequency resolution. A lower frequency resolution is favorable since it results in less parameters to be transmitted.

For each source, the amplitude/delay panning and gain can be adjusted individually. The algorithm was used for coding of several multi-track audio recordings with 12-14 tracks.

The decoder allows 5.1 surround mixing using a vector base amplitude panning (VBAP) mixer. Direction and gain of each source signal can be adjusted. The software allows on the-fly switching between mixing the coded source signal and mixing the original discrete source signals.

Casual listening usually reveals no or little difference between mixing the coded or original source signals if for each source a gain $G_i$ of zero dB is used. The more the source gains are varied the more artifacts occur. Slight amplification and attenuation of the sources (e.g. up to ±6 dB) still sounds good. A critical scenario is when all the sources are mixed to one side and only a single source to the other opposite side. In this case the audio quality may be reduced, depending on the specific mixing and source signals.

IX. Conclusions

A coding scheme for joint-coding of audio source signals, e.g. the channels of a multi-track recording, was proposed. The goal is not to code the source signal waveforms with high quality, in which case joint-coding would give minimal coding gain since the audio sources are usually independent. The goal is that when the coded source signals are mixed a high quality audio signal is obtained. By considering statistical properties of the source signals, the properties of mixing schemes, and spatial hearing it was shown that significant coding gain improvement is achieved by jointly coding the source signals.

The coding gain improvement is due to the fact that only one audio waveform is transmitted.

Additionally side information, representing the statistical properties of the source signals which are the relevant factors determining the spatial perception of the final mixed signal, are transmitted.

The side information rate is about 3 kbs per source signal. Any mixer can be applied with the coded source signals, e.g. stereo, multi-channel, or wavefield synthesis mixers.

It is straight forward to scale the proposed scheme for higher bitrate and quality by means of transmitting more than one audio channel. Furthermore, a variation of the scheme was proposed which allows re-mixing of the given stereo or multi-channel audio signal (and even changing of the audio format, e.g. stereo to multi-channel or wavefield synthesis).

The applications of the proposed scheme are manifold. For example MPEG-4 could be extended with the proposed scheme to reduce bitrate when more than one "natural audio object" (source signal) needs to be transmitted. Also, the proposed scheme offers compact representation of content for wavefield synthesis systems. As mentioned, existing stereo or multi-channel signals could be complemented with side information to allow that the user re-mixes the signals to his liking.

REFERENCES

[1] C. Faller, Parametric Coding of Spatial Audio, Ph.D. thesis, Swiss Federal Institute of Technology Lausanne (EPFL), 2004, Ph.D. Thesis No. 3062.

[2] C. Faller and F. Baumgarte, "Binaural Cue Coding—Part II: Schemes and applications," IEEE Trans. on Speech and Audio Proc., vol. 11, no. 6, November 2003.

The invention claimed is:

1. A method for synthesizing a plurality of audio channels, comprising:
   retrieving from an audio stream at least one sum signal representing a sum of source signals,
   retrieving from the audio stream statistical information about one or more source signals,
   receiving from the audio stream, or determining locally, parameters describing the output audio format and mixing parameters, computing pseudo source signals from the at least one sum signal and the retrieved statistical information, and
   synthesizing the plurality of audio channels from the pseudo source signals using a mixer, on which the received or locally determined audio format parameters and the received or locally determined mixing parameters are applied.

2. A method for synthesizing a plurality of audio channels, comprising:
retrieving from an audio stream at least one sum signal representing a sum of source signals,
retrieving from the audio stream statistical information about one or more source signals,
receiving from the audio stream, or determining locally, parameters describing an output audio format and source mixing parameters,
computing output mixer parameters from the received statistical information, the parameters describing an output audio format, and the source mixing parameters, and
synthesizing the plurality of audio channels from the at least one sum signal based on the computed output mixer parameters.

3. The method of claim 1 or 2 wherein the statistical information represents spectral envelopes of the source signals, spectral envelopes of the one or more source signals comprise lattice filter parameters or line spectral parameters, or a relative power as a function of frequency and time of the plurality of source signals.

4. The method of claim 2, wherein the step of computing the output mixer parameters comprises computing cues of the plurality of audio channels and computing the output mixer parameters using the computed cues of the plurality of audio channels.

5. The method of claim 1, wherein the pseudo source signals are computed in a subband domain of a filterbank.

6. The method of claim 2, wherein the audio channels are synthesized in a subband domain of a filterbank.

7. The method of claim 5 or 6, wherein a number and bandwidths of the subband domain are determined according to a spectral and temporal resolution of a human auditory system.

8. The method of claim 5 or 6, wherein the number of subbands is between 3 and 40.

9. The method of claim 5 or 6, wherein subbands in the subband domain have different bandwidths, and subbands at lower frequencies have smaller bandwidths than subbands at higher frequencies.

10. The method of claim 5 or 6, wherein a short time Fourier transform based filterbank is used and spectral coefficients are combined to form groups of spectral coefficients such that each group of spectral coefficients forms a subband.

11. The method of claim 1 or 2, wherein the statistical information also includes auto-correlation functions.

12. The method of claim 3, wherein the spectral envelopes are represented as linear predictive coding parameters.

13. The method of claim 1, wherein the sum signal is divided into a plurality of subbands, and the statistical information is used to determine the power of each subband for each pseudo-source signal.

14. The method of claim 1, wherein a linear prediction error of the sum signal is computed, followed by all-pole filtering to impose the spectral envelope determined by the statistical information for each pseudo-source signal.

15. The method of claim 13 or 14, wherein a de-correlation technique is used for making the output pseudo-source signals independent.

16. The method of claim 4, wherein the computed cues are level difference, time difference, or coherence for different frequencies and time instants.

17. The method of claim 1, wherein the mixer is an amplitude panning algorithm compensating for source level dependence on mixing parameters, a wavefield synthesis mixer, a binaural mixer, or a 3D audio mixer.

18. An apparatus arranged to synthesize a plurality of audio channels, the apparatus comprising:
means for retrieving from an audio stream at least one sum signal representing a sum of source signals;
means for retrieving from the audio stream statistical information about one or more source signals;
means for receiving from the audio stream, or determining locally, parameters describing an output audio format and mixing parameters;
means for computing pseudo source signals from the at least one sum signal and the retrieved statistical information; and
means for synthesizing the plurality of audio channels from the pseudo source signals using a mixer, on which the received or locally determined audio format parameters and the received or locally determined mixing parameters are applied.

19. An apparatus arranged to synthesize a plurality of audio channels, the apparatus comprising:
means for retrieving from an audio stream at least one sum signal representing a sum of source signals;
means for retrieving from the audio stream statistical information about one or more source signals;
means for receiving from the audio stream, or determining locally, parameters describing an output audio format and mixing parameters;
means for computing output mixer parameters from the received statistical information, the parameters describing an output audio format and the source mixing parameters; and
means for synthesizing the plurality of audio channels from the at least one sum signal based on the computed output mixer parameters.

* * * * *